(12) United States Patent
Kister (10) Patent No.: US 8,723,546 B2
(45) Date of Patent: May 13, 2014

(54) VERTICAL GUIDED LAYERED PROBE

(75) Inventor: January Kister, Portola Valley, CA (US)

(73) Assignee: MicroProbe, Inc., Carlsbad, CA (US)

( * ) Notice: Subject to any disclaimer, the term of this patent is extended or adjusted under 35 U.S.C. 154(b) by 99 days.

(21) Appl. No.: 12/715,896

(22) Filed: Mar. 2, 2010

(65) Prior Publication Data

US 2010/0176832 A1 Jul. 15, 2010

Related U.S. Application Data

(63) Continuation-in-part of application No. 11/975,743, filed on Oct. 19, 2007, now Pat. No. 7,671,610.

(51) Int. Cl.
*G01R 31/00* (2006.01)
*G01R 31/20* (2006.01)
*G01R 1/073* (2006.01)
*G01R 1/067* (2006.01)

(52) U.S. Cl.
CPC .......... *G01R 1/07314* (2013.01); *G01R 1/0675* (2013.01); *G01R 1/06755* (2013.01)
USPC ............. 324/756.07; 324/754.03; 324/754.11

(58) Field of Classification Search
USPC ............. 324/760.01, 763.01, 762.05, 755.06, 324/756.03, 755.1
See application file for complete search history.

(56) References Cited

U.S. PATENT DOCUMENTS

| | | |
|---|---|---|
| 3,518,612 A | 6/1970 | Dunman et al. |
| 3,599,093 A | 8/1971 | Oates |
| 3,710,251 A | 1/1973 | Hagge et al. |
| 3,812,311 A | 5/1974 | Kvaternik |
| 4,027,935 A | 6/1977 | Byrnes et al. |
| 4,115,736 A | 9/1978 | Tracy |
| 4,116,523 A | 9/1978 | Coberly et al. |
| 4,314,855 A | 2/1982 | Chang et al. |
| 4,423,376 A | 12/1983 | Byrnes et al. |
| 4,525,697 A | 6/1985 | Jones et al. |
| 4,532,423 A | 7/1985 | Tojo et al. |
| 4,567,433 A | 1/1986 | Ohkubo et al. |
| 4,593,961 A | 6/1986 | Cosmo |

(Continued)

FOREIGN PATENT DOCUMENTS

| | | |
|---|---|---|
| DE | 4237591 | 5/1994 |
| EP | 144682 A1 * | 6/1985 |

(Continued)

OTHER PUBLICATIONS

Machine Translation of European Publication EP 144682 A1, Translated on Mar. 20, 2012.*

(Continued)

*Primary Examiner* — Jermele M Hollington
(74) *Attorney, Agent, or Firm* — Deborah A. Peacock; Philip D. Askenazy; Peacock Myers, P.C.

(57) ABSTRACT

The present invention is a set of layered probes that make electrical contact to a device under test. The layered probes are disposed within openings of at least one guide plate. The guide plate surrounds the probes via the openings. The layered probes have a base end, an opposing tip end and a shaft connecting the base end to the tip end. The base end can have a positioning device that extends away from the base end.

28 Claims, 4 Drawing Sheets

(56) References Cited

U.S. PATENT DOCUMENTS

| | | | |
|---|---|---|---|
| 4,618,767 A | 10/1986 | Smith et al. | |
| 4,618,821 A | 10/1986 | Lenz | |
| 4,706,019 A | 11/1987 | Richardson | |
| 4,730,158 A | 3/1988 | Kasai et al. | |
| 4,747,698 A | 5/1988 | Wickramasinghe et al. | |
| 4,757,255 A | 7/1988 | Margozzi | |
| 4,772,846 A | 9/1988 | Reeds | |
| 4,773,877 A | 9/1988 | Kruger et al. | |
| 4,807,159 A | 2/1989 | Komatsu et al. | |
| 4,871,964 A | 10/1989 | Boll et al. | |
| 4,901,013 A | 2/1990 | Benedetto et al. | |
| 4,967,148 A | 10/1990 | Doemens et al. | |
| 4,973,903 A | 11/1990 | Schemmel | |
| 5,015,947 A | 5/1991 | Chism | |
| 5,026,291 A | 6/1991 | David | |
| 5,030,318 A | 7/1991 | Reche | |
| 5,061,192 A | 10/1991 | Chapin et al. | |
| 5,067,007 A | 11/1991 | Otsuka et al. | |
| 5,145,384 A | 9/1992 | Asakawa et al. | |
| 5,205,739 A | 4/1993 | Malo et al. | |
| 5,207,585 A | 5/1993 | Byrnes | |
| 5,225,771 A | 7/1993 | Leedy | |
| 5,230,632 A | 7/1993 | Baumberger et al. | |
| 5,237,743 A | 8/1993 | Busacco et al. | |
| 5,354,205 A | 10/1994 | Feigenbaum et al. | |
| 5,399,982 A | 3/1995 | Driller | |
| 5,422,574 A | 6/1995 | Kister | |
| 5,430,614 A | 7/1995 | Difrancesco | |
| 5,436,571 A | 7/1995 | Karasawa | |
| 5,468,994 A | 11/1995 | Pendse | |
| 5,476,211 A | 12/1995 | Khandros | |
| 5,531,022 A | 7/1996 | Beaman et al. | |
| 5,576,631 A | 11/1996 | Stowers et al. | |
| 5,632,631 A | 5/1997 | Fjelstad et al. | |
| 5,635,846 A | 6/1997 | Beaman et al. | |
| 5,642,056 A | 6/1997 | Nakajima et al. | |
| 5,644,249 A | 7/1997 | Kister | |
| 5,676,599 A | 10/1997 | Ricks et al. | |
| 5,701,085 A | 12/1997 | Malladi | |
| 5,720,098 A | 2/1998 | Kister | |
| 5,742,174 A * | 4/1998 | Kister et al. | 324/750.16 |
| 5,751,157 A | 5/1998 | Kister | |
| 5,764,070 A | 6/1998 | Pedder | |
| 5,764,072 A | 6/1998 | Kister | |
| 5,764,409 A | 6/1998 | Colvin | |
| 5,767,691 A | 6/1998 | Verkuil | |
| 5,772,451 A | 6/1998 | Dozier, II et al. | |
| 5,773,987 A * | 6/1998 | Montoya | 324/754.2 |
| 5,802,699 A | 9/1998 | Fjelstad et al. | |
| 5,806,181 A | 9/1998 | Khandros et al. | |
| 5,821,763 A | 10/1998 | Beamann et al. | |
| 5,829,128 A | 11/1998 | Eldridge et al. | |
| 5,832,601 A | 11/1998 | Eldridge et al. | |
| 5,834,946 A | 11/1998 | Albrow et al. | |
| 5,847,936 A | 12/1998 | Forehand | |
| 5,852,871 A | 12/1998 | Khandros | |
| 5,864,946 A | 2/1999 | Eldridge et al. | |
| 5,884,395 A | 3/1999 | Dabrowiecki et al. | |
| 5,892,539 A | 4/1999 | Colvin | |
| 5,914,613 A | 6/1999 | Gleason et al. | |
| 5,917,707 A | 6/1999 | Khandros et al. | |
| 5,923,178 A | 7/1999 | Higgins et al. | |
| 5,926,951 A | 7/1999 | Khandros et al. | |
| 5,932,323 A | 8/1999 | Throssel | |
| 5,934,914 A | 8/1999 | Fjelstad et al. | |
| 5,936,421 A | 8/1999 | Stowers et al. | |
| 5,945,836 A | 8/1999 | Sayre et al. | |
| 5,952,843 A | 9/1999 | Vinh | |
| 5,969,533 A | 10/1999 | Takagi | |
| 5,970,167 A | 10/1999 | Colvin | |
| 5,974,662 A | 11/1999 | Eldridge et al. | |
| 5,994,152 A | 11/1999 | Khandros et al. | |
| 6,027,630 A | 2/2000 | Cohen | |
| 6,029,344 A | 2/2000 | Khandros et al. | |
| 6,031,282 A | 2/2000 | Jones et al. | |
| 6,064,215 A | 5/2000 | Kister | |
| 6,066,957 A | 5/2000 | Van Loan et al. | |
| 6,071,630 A | 6/2000 | Tomaru et al. | |
| 6,086,386 A | 7/2000 | Fjelstad et al. | |
| 6,133,072 A | 10/2000 | Fjelstad | |
| 6,184,576 B1 | 2/2001 | Jones et al. | |
| 6,204,674 B1 | 3/2001 | Dabrowiecki et al. | |
| 6,205,660 B1 | 3/2001 | Fjelstad et al. | |
| 6,215,320 B1 | 4/2001 | Parrish | |
| 6,218,203 B1 | 4/2001 | Khoury et al. | |
| 6,246,245 B1 | 6/2001 | Akram et al. | |
| 6,246,247 B1 | 6/2001 | Eldridge et al. | |
| 6,247,228 B1 | 6/2001 | Distefano et al. | |
| 6,255,126 B1 | 7/2001 | Mathieu et al. | |
| 6,259,261 B1 | 7/2001 | Engelking et al. | |
| 6,278,284 B1 | 8/2001 | Mori et al. | |
| 6,292,003 B1 | 9/2001 | Fredrickson et al. | |
| 6,334,247 B1 | 1/2002 | Beaman et al. | |
| 6,336,269 B1 | 1/2002 | Eldridge et al. | |
| 6,344,753 B1 | 2/2002 | Takada et al. | |
| 6,359,452 B1 | 3/2002 | Mozzetta | |
| 6,411,112 B1 * | 6/2002 | Das et al. | 324/754.2 |
| 6,414,502 B1 | 7/2002 | Sayre et al. | |
| 6,419,500 B1 | 7/2002 | Kister | |
| 6,420,887 B1 | 7/2002 | Kister et al. | |
| 6,424,164 B1 | 7/2002 | Kister | |
| 6,433,571 B1 | 8/2002 | Montoya | |
| 6,437,584 B1 | 8/2002 | Gleason et al. | |
| 6,441,315 B1 | 8/2002 | Eldridge et al. | |
| 6,443,784 B1 | 9/2002 | Kimoto | |
| 6,482,013 B2 | 11/2002 | Eldridge et al. | |
| 6,483,328 B1 | 11/2002 | Eldridge et al. | |
| 6,486,689 B1 | 11/2002 | Nishikawa | |
| 6,496,026 B1 | 12/2002 | Long et al. | |
| 6,525,552 B2 * | 2/2003 | Kister | 324/754.07 |
| 6,529,021 B1 | 3/2003 | Yu et al. | |
| 6,530,148 B1 | 3/2003 | Kister | |
| 6,538,336 B1 | 3/2003 | Secker et al. | |
| 6,566,898 B2 | 5/2003 | Theissen et al. | |
| 6,570,396 B1 | 5/2003 | Kister | |
| 6,573,738 B1 | 6/2003 | Matsuo et al. | |
| 6,575,767 B2 | 6/2003 | Satoh et al. | |
| 6,576,485 B2 | 6/2003 | Zhou et al. | |
| 6,586,955 B2 | 7/2003 | Fjelstad et al. | |
| 6,615,485 B2 | 9/2003 | Eldridge et al. | |
| 6,624,648 B2 | 9/2003 | Eldridge et al. | |
| 6,633,176 B2 | 10/2003 | Takemoto et al. | |
| 6,641,430 B2 | 11/2003 | Zhou et al. | |
| 6,646,455 B2 | 11/2003 | Maekawa et al. | |
| 6,676,438 B2 | 1/2004 | Zhou et al. | |
| 6,677,245 B2 | 1/2004 | Zhou et al. | |
| 6,690,185 B1 | 2/2004 | Khandros et al. | |
| 6,707,311 B2 | 3/2004 | Hohenwarter | |
| 6,727,719 B2 | 4/2004 | Liao et al. | |
| 6,731,123 B2 | 5/2004 | Kimoto | |
| 6,765,228 B2 | 7/2004 | Lin et al. | |
| 6,768,331 B2 | 7/2004 | Longson et al. | |
| 6,825,422 B2 | 11/2004 | Eldridge et al. | |
| 6,842,023 B2 | 1/2005 | Yoshida et al. | |
| 6,847,221 B2 | 1/2005 | Kimoto et al. | |
| 6,853,208 B2 | 2/2005 | Okubo et al. | |
| 6,881,974 B2 | 4/2005 | Wood et al. | |
| 6,890,185 B1 | 5/2005 | Kister et al. | |
| 6,891,385 B2 | 5/2005 | Miller | |
| 6,897,666 B2 | 5/2005 | Swettlen et al. | |
| D507,198 S | 7/2005 | Kister | |
| 6,917,102 B2 | 7/2005 | Zhou et al. | |
| 6,917,525 B2 | 7/2005 | Mok et al. | |
| D510,043 S | 9/2005 | Kister | |
| 6,945,827 B2 | 9/2005 | Grube et al. | |
| 6,956,389 B1 | 10/2005 | Mai | |
| 6,965,244 B2 | 11/2005 | Miller | |
| 6,965,245 B2 | 11/2005 | Kister et al. | |
| 6,970,005 B2 | 11/2005 | Rincon et al. | |
| 7,015,707 B2 | 3/2006 | Cherian | |
| 7,036,221 B2 | 5/2006 | Higashida et al. | |
| 7,046,021 B2 | 5/2006 | Kister | |
| 7,059,865 B2 | 6/2006 | Kister et al. | |
| 7,064,564 B2 | 6/2006 | Kister et al. | |

(56) References Cited

U.S. PATENT DOCUMENTS

| | | |
|---|---|---|
| 7,068,057 B2 | 6/2006 | Tervo et al. |
| D525,207 S | 7/2006 | Kister et al. |
| 7,071,715 B2 | 7/2006 | Shinde et al. |
| 7,073,254 B2 | 7/2006 | Eldridge et al. |
| 7,078,921 B2 | 7/2006 | Haga et al. |
| 7,088,118 B2 | 8/2006 | Liu et al. |
| 7,091,729 B2 | 8/2006 | Kister |
| 7,108,546 B2 | 9/2006 | Miller et al. |
| 7,109,731 B2 | 9/2006 | Gleason et al. |
| 7,126,361 B1 | 10/2006 | Anderson et al. |
| 7,143,500 B2 | 12/2006 | Byrd |
| 7,148,709 B2 | 12/2006 | Kister |
| 7,150,658 B1 | 12/2006 | Chien |
| 7,173,441 B2 | 2/2007 | Kister et al. |
| 7,189,078 B2 | 3/2007 | Kister et al. |
| 7,202,682 B2 | 4/2007 | Cooper et al. |
| 7,217,138 B2 | 5/2007 | Kister et al. |
| 7,218,127 B2 | 5/2007 | Cooper et al. |
| 7,218,131 B2 | 5/2007 | Tanioka et al. |
| 7,225,538 B2 | 6/2007 | Eldridge et al. |
| 7,227,371 B2 | 6/2007 | Miller |
| 7,265,565 B2 | 9/2007 | Chen et al. |
| 7,274,195 B2 | 9/2007 | Takemoto et al. |
| 7,281,305 B1 | 10/2007 | Iyer |
| 7,285,966 B2 | 10/2007 | Lee et al. |
| 7,312,617 B2 | 12/2007 | Kister |
| 7,345,492 B2 | 3/2008 | Kister |
| 7,417,447 B2 | 8/2008 | Kister |
| 7,436,192 B2 | 10/2008 | Kister |
| 7,511,523 B2 | 3/2009 | Chen et al. |
| 7,514,948 B2 | 4/2009 | Kister |
| 7,649,367 B2 | 1/2010 | Kister |
| 7,659,739 B2 | 2/2010 | Kister |
| 7,667,471 B2 | 2/2010 | Kurotori et al. |
| 7,671,610 B2 * | 3/2010 | Kister .................... 324/750.16 |
| 7,733,101 B2 | 6/2010 | Kister |
| 7,733,103 B2 | 6/2010 | Park et al. |
| 7,759,949 B2 | 7/2010 | Kister |
| 7,786,740 B2 | 8/2010 | Kister |
| RE43,503 E | 7/2012 | Kister |
| 8,230,593 B2 | 7/2012 | Kister |
| 8,415,963 B2 | 4/2013 | Kister |
| RE44,407 E | 8/2013 | Kister |
| 2001/0012739 A1 | 8/2001 | Grube et al. |
| 2001/0040460 A1 | 11/2001 | Beaman et al. |
| 2002/0070743 A1 | 6/2002 | Felici et al. |
| 2002/0125584 A1 | 9/2002 | Umehara et al. |
| 2002/0153913 A1 | 10/2002 | Okubo et al. |
| 2002/0177782 A1 | 11/2002 | Penner |
| 2002/0190738 A1 | 12/2002 | Beaman et al. |
| 2002/0194730 A1 | 12/2002 | Shih et al. |
| 2003/0027423 A1 | 2/2003 | Zhou et al. |
| 2003/0116346 A1 | 6/2003 | Forster et al. |
| 2003/0218865 A1 | 11/2003 | Macias |
| 2004/0036493 A1 | 2/2004 | Miller |
| 2004/0046579 A1 | 3/2004 | Chraft et al. |
| 2004/0104737 A1 | 6/2004 | Haga et al. |
| 2004/0119485 A1 * | 6/2004 | Koch et al. .................... 324/754 |
| 2004/0239352 A1 | 12/2004 | Mizoguchi |
| 2005/0012513 A1 | 1/2005 | Cheng |
| 2005/0179458 A1 | 8/2005 | Chen et al. |
| 2005/0184743 A1 | 8/2005 | Kimura |
| 2005/0189955 A1 | 9/2005 | Takemoto et al. |
| 2005/0189958 A1 | 9/2005 | Chen et al. |
| 2006/0006887 A1 * | 1/2006 | Kister ........................... 324/754 |
| 2006/0033516 A1 | 2/2006 | Rincon et al. |
| 2006/0040417 A1 | 2/2006 | Eldridge et al. |
| 2006/0073712 A1 | 4/2006 | Suhir |
| 2006/0082380 A1 | 4/2006 | Tanioka et al. |
| 2006/0170440 A1 | 8/2006 | Sudin |
| 2006/0171425 A1 | 8/2006 | Lee et al. |
| 2006/0186905 A1 | 8/2006 | Kohashi et al. |
| 2006/0189867 A1 * | 8/2006 | Revie et al. .................... 600/424 |
| 2006/0208752 A1 | 9/2006 | Tanioka et al. |
| 2006/0261828 A1 | 11/2006 | Cram et al. |
| 2007/0145989 A1 | 6/2007 | Zhu et al. |
| 2007/0167022 A1 | 7/2007 | Tsai et al. |
| 2007/0229103 A1 | 10/2007 | Tani |
| 2008/0001613 A1 | 1/2008 | Kister |
| 2008/0074132 A1 | 3/2008 | Fan et al. |
| 2008/0088331 A1 | 4/2008 | Yoshida |
| 2008/0258746 A1 | 10/2008 | Tran et al. |
| 2009/0201041 A1 | 8/2009 | Kister |
| 2010/0109691 A1 | 5/2010 | Kister |
| 2010/0176832 A1 | 7/2010 | Kister |
| 2010/0182030 A1 | 7/2010 | Kister |
| 2010/0182031 A1 | 7/2010 | Kister |
| 2010/0289512 A1 | 11/2010 | Kister |
| 2011/0006796 A1 | 1/2011 | Kister |
| 2011/0062978 A1 | 3/2011 | Kister |
| 2011/0273198 A1 | 11/2011 | Kister |
| 2011/0273199 A1 | 11/2011 | Kister |
| 2013/0093450 A1 | 4/2013 | Kister |

FOREIGN PATENT DOCUMENTS

| | | |
|---|---|---|
| EP | 0764352 | 5/2004 |
| JP | 63-307678 | 12/1988 |
| JP | 01128535 | 5/1989 |
| JP | 7-021968 | 1/1995 |
| JP | 7-333232 | 12/1995 |
| JP | 10-506238 | 6/1998 |
| JP | 10-221374 | 8/1998 |
| JP | 10311864 | 11/1998 |
| JP | 11044727 | 2/1999 |
| JP | 11241690 | 8/1999 |
| TW | 201109669 | 3/2011 |
| WO | WO 8704568 | 7/1987 |
| WO | WO 92/10010 | 6/1992 |
| WO | WO 96/15458 | 5/1996 |
| WO | WO 96/37332 | 11/1996 |
| WO | WO 9743653 | 11/1997 |
| WO | WO00/54066 | 9/2000 |
| WO | WO 01/09623 | 2/2001 |

OTHER PUBLICATIONS

Levy, Larry, "Water Probe TM System", *Southwest Workshop* formfactor Inc. Jun. 1997, 1-19.

Sporck, Nicholas, "A New Probe Card Technology Using Compliant Microsprings", *Proceedings 1997 IEEE International Test Conference*, Jan. 1, 1997, pp. 527-532.

\* cited by examiner

VERTICAL GUIDED LAYERED PROBE

CROSS-REFERENCE TO RELATED APPLICATIONS

This application is a continuation-in-part of application of U.S. patent application Ser. No. 11/975,743, entitled "Vertical Guided Probe Array Providing Sideways Scrub Motion", to January Kister, filed on Oct. 19, 2007 now U.S. Pat. No. 7,671,610, and the specification and claims thereof are incorporated herein by reference.

BACKGROUND OF THE INVENTION

1. Field of the Invention (Technical Field)

This invention relates to making temporary electrical contact to devices or circuits under test.

2. Description of Related Art

Testing of electronic devices and circuits prior to final packaging is an important aspect of integrated circuit fabrication, and has been significant for some time. Accordingly, methods of making temporary electrical contact for such testing have been thoroughly investigated. It is helpful to classify probes for making temporary electrical contact as being either horizontal probes or vertical probes. Horizontal probes are substantially parallel to the chip plane. For example, a horizontal probe array can be arranged as a set of horizontal needles extending inward from a frame to make contact to pads at the periphery of an IC chip.

Figure 1A:
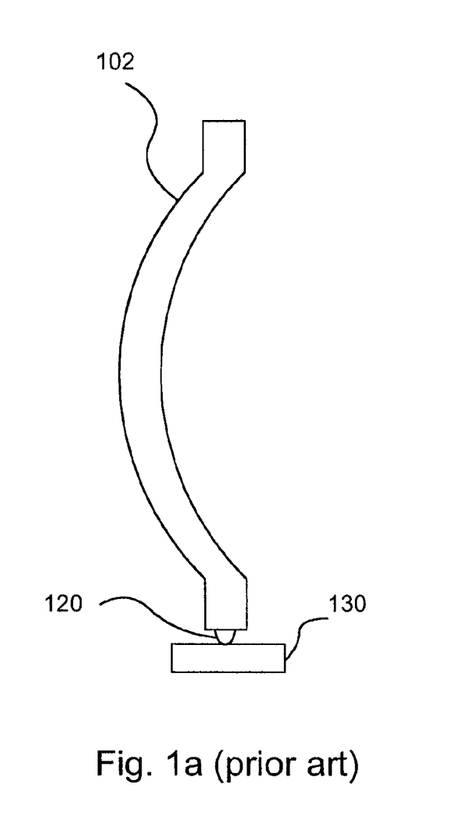
FIG. 1a shows a side view of a conventional vertical probe.
Figure 1B:
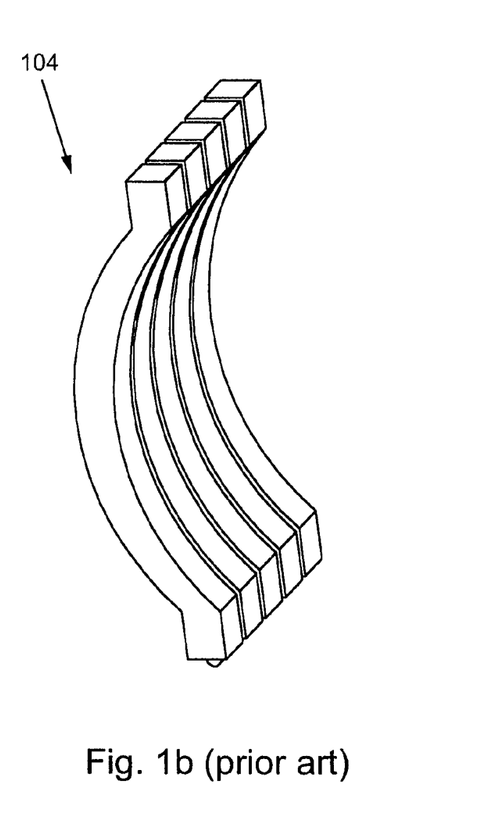
FIG. 1b shows an oblique view of a conventional vertical probe array.

In contrast, vertical probes are substantially perpendicular to the chip plane. For example, in FIG. 1a, vertical probe 102 is shown having tip 120 making contact with contact pad 130, where contact pad 130 is shown in side view. Frequently, as shown here, vertical probes include a curved section. One purpose of the curved section of a vertical probe is to help determine the exact nature of scrub motion tip 120 makes with respect to contact pad 130 when contact is made. The ability to fine-tune such scrub motion by appropriate probe design is a significant advantage of vertical probe relative to horizontal probes. Arrays of vertical probes, such as 104 on FIG. 1b, are also known in the art. This figure illustrates another advantage of vertical probes relative to horizontal probes, namely that arrays of vertical probes can often be more closely packed than similar arrays of horizontal probes, particularly for 2-D probe arrays.

Vertical probes are referred to as guided probes if they probe assembly includes one or more guide plates having slots through which the probes pass to control probe motion. In some cases, no guide plates are employed, and the resulting vertical probes are referred to as "free" (i.e., un-guided) vertical probes. U.S. Pat. No. 5,923,178 is a representative prior art example of free vertical probes. U.S. Pat. No. 4,901,013, U.S. Pat. No. 5,952,843, and U.S. Pat. No. 5,945,836 are representative examples of prior art guided vertical probe approaches.

As electronic circuit technology progresses, contact pads tend to become smaller and more closely spaced, which places increasingly severe demands on probe technology. For example, probing of contact pads spaced by 80 μm or less is presently of increasing interest in manufacturing. As described in greater detail below, conventional vertical probe approaches tend to fail for such small pitches.

Accordingly, it would be an advance in the art to provide vertical probing of contact pads having a pitch of 80 μm or less.

BRIEF SUMMARY OF THE INVENTION

One embodiment of the present invention comprises an apparatus for making electrical contact to a device under test. This embodiment preferably comprises a set of two or more layered probes, each probe of the set including a base end, an opposing distal tip end, and a shaft connecting the base end to the tip end, at least one guide plate comprising openings, and the probes are disposed within the openings, the guide plate surrounds the probes via the openings. The embodiment preferably has the tip ends of the set of probes disposed along an arrangement of contact pads. The guide plate can be an upper guide plate having openings within which the probe base ends of the set of probes are disposed or a lower guide plate having openings within which the probe tip ends of said set of probes are disposed. This embodiment can optionally comprise both an upper guide plate and a lower guide plate. There can also be two lower guide plates.

Each probe, tip end and base end preferably have a different material composition than the shaft, the compositions are preferably suitable for making temporary electrical contact via mechanical contact. In this embodiment, each probe is preferably replaceable in the apparatus. Each base end of each probe preferably comprises a positioning device for fixing a position of each probe. The tip end of each probe preferably comprises a tip for making electrical contact to the device under test. This embodiment of the present invention optionally comprises a second lower guide plate, within which the probe tip ends are disposed.

Another embodiment of the present invention comprises a second set of two or more probes, each probe of the second set including a base end, a tip end, and a shaft connecting the base end to the tip end, wherein the at least one guide plate includes openings within which said second set of probes are disposed, the guide plate surrounding the second set of probes via the openings. The second set of one or more the probes are preferably disposed such that the tip ends of the second set of probes are disposed along a second arrangement of contact pads. The apparatus preferably has tip ends of the first set of probes spaced by a first pitch and the tip ends of the second set of probes spaced by a second pitch. The first pitch and the second pitch are preferably substantially equal, and the first and second sets of probes are offset from each other by substantially half the first pitch in a direction X. A center line of the apparatus is preferably parallel to and substantially halfway between the first and second probe array lines.

Each tip end of each probe of the first and second sets of probes further comprises a tip for making electrical contact to the device under test, wherein each tip is displaced from a center of its corresponding probe toward the center line, whereby separation between the first and second sets of probes can be increased. Each base end of each probe of the first and second sets of probes optionally further includes a positioning device for fixing a position of each probe, and wherein each positioning device is disposed on a side of its corresponding probe facing away from the center line. Each shaft of each probe of the first and second sets of probes curves in the same direction. The set of probes preferably comprise a substantially rectangular cross section. The rectangular cross section of the set of probes preferably comprises a lateral dimension Xp1 in a direction X parallel to the probe array line and has a second lateral dimension Yp1 in a direction Y perpendicular to the probe array line, wherein Xp1<Yp1. In this embodiment of the present invention, the probes are preferably substantially vertical. The set of probes are preferably substantially aligned with a vertical direction Z perpendicular to the probe array line, and wherein each probe shaft of the first set of probes has a predetermined curvature in an X-Z plane. There is a sideways scrub motion of the tip ends of the set of probes as contact is made to an array of contact pads on the device under test. The probes preferably comprise metallic layers. A tip pedestal disposed on the tip end is optional in this embodiment. At least one said guide plate preferably comprises an electrically insulated material.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Improved probing of closely spaced contact pads is provided by an array of guided vertical probes that has a sideways scrub relative to the line of contact pads. With this orientation of scrub motion, the probes can be relatively thin along the contact line, and relatively thick perpendicular to the contact line. The thin dimension of the probes allows for probing closely spaced contact pads, while the thick dimension of the probes provides mechanical robustness and current carrying capacity. The probes have a predetermined curvature in a plane including the contact line, to help determine the amount of scrub motion during contact. In one embodiment, an array of probes is provided for probing two closely spaced and parallel rows of contact pads, offset from each other by half the contact pad pitch. Features of this embodiment include disposing the tips of each probe close to the center line of the probe array, and disposing positioning devices for setting the vertical position of the probes with respect to an upper guide plate such that the positioning devices face away from the center line.

In order to better appreciate the invention, it is helpful to consider some of the factors that come into play as pitch is decreased in the conventional probe array of FIG. 1b. These factors can be more clearly understood by reference to FIG. 1c, which shows array of contact pads 106, arranged along line 108, where the probe tip scrub direction is shown as 110.

Figure 1C:
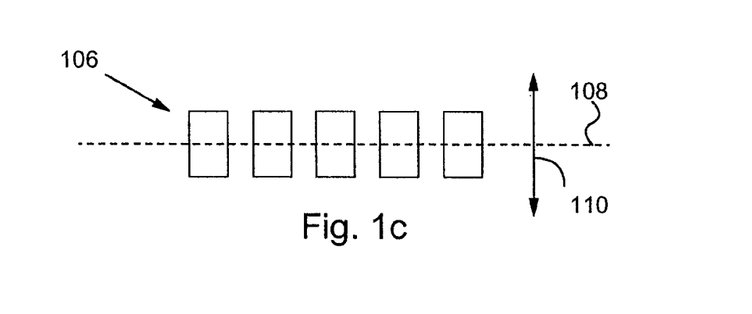
FIG. 1c shows the relation between contact pad arrangement and scrub direction for the probe array of FIG. 1b.

Scrub direction 110 is as shown because of the curvature of probes 102 in array 104. The scrub motion is generally in the same plane as the probe curvature, since otherwise the probe curvature has little influence on the scrub motion. Decreasing the pitch of the contact pads requires a corresponding decrease in the probe width (i.e., the probe dimension parallel to line 108). If the probe width is decreased while holding the probe length (i.e., the probe dimension parallel to scrub direction 110) constant, there will be an undesirable tendency for the probe to preferentially deform laterally (i.e., along direction 108, as opposed to along direction 110) in an uncontrollable manner, because the probe will be stiffer along direction 110 than along direction 108. Note that the curvature of probes 102 in array 104 acts to control probe deformation in direction 110, not direction 108. Such uncontrollable lateral probe deformation is undesirable because it could lead to probes incorrectly making contact with neighboring contact pads.

The problem of preferential lateral probe deformation can be avoided by decreasing the probe length as the probe width is decreased. However, the resulting probe ends up being a thin, wire-like probe, which is hard to handle, mechanically fragile, and cannot readily be designed to provide a controlled degree of scrub motion. Such a wire probe can be regarded as having an undesirable tendency to deform uncontrollably in any direction.

According to embodiments of the present invention, fine-pitch vertical probing is provided by probe arrays providing a controlled "sideways" scrub motion. More specifically, such a sideways scrub motion is shown on FIG. 4, where an array of contact pads 402 are arranged along line 406 and probe scrub direction 404 is parallel to line 406. The significance of the difference between the conventional scrub motion direction of FIG. 1c and the sideways scrub of FIG. 4 can be better appreciated by consideration of the following specific example of a preferred embodiment of the invention.

Figure 2A:
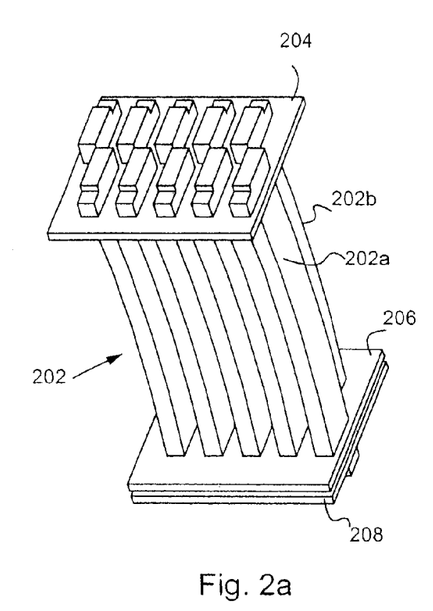
FIGS. 2a-b show two oblique views of a vertical probe assembly according to an embodiment of the invention.
Figure 2B:
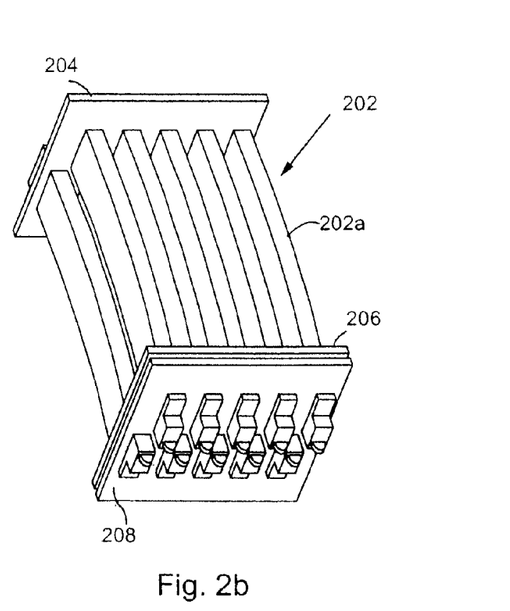

FIGS. 2a-b show two oblique views of a vertical probe assembly according to an embodiment of the invention. FIGS. 3a-d show four orthogonal views of the embodiment of FIGS. 2a-b. In this example, vertical probe array 202 is supported by upper guide plate 204 and by first and second lower guide plates 206 and 208 respectively. Two of the probes are referenced as 202a and 202b. Thus this example is a guided probe array. The probes pass through slots or other type of opening in the respective guide plates, which serve to control probe position and scrub motion during contact. More specifically, the probes can have a feature (e.g., positioning device 508 as shown on FIG. 5) which can engage with upper guide plate 204 for setting the vertical probe position. Lower guide plates 206 and 208 serve to control probe lateral position and to provide control of the scrub motion. In some cases, two lower guide plates are employed as shown. This arrangement is preferred because with two lower guide plates, the channel that guides the probes is increased in length, thereby reducing scrub motion. The invention can also be practiced with one or with three or more lower guide plates. Preferably, any or all of the probes of array 202 are replaceable in the probe assembly.

Guide plates 204, 206, and 208 can be made from any material having sufficient mechanical strength and durability for supporting probe array 202. It is important that guide plates 204, 206, and 208 not provide electrical connection between probes of array 202, so guide plates 204, 206, and 208 can be entirely fabricated from electrically insulating material or can include insulating material sufficient to electrically isolate the probes from each other.

In one embodiment of the present invention, a set of probes are disposed in at least one guide plate comprising openings. In this embodiment, the guide plate preferably surrounds the probes via the openings. Embodiments of the invention are suitable for any number of guide plates. In addition, any portion of a probe (i.e. base end, tip end, shaft) can be disposed in and/or surrounded by a guide plate. One embodiment comprises an upper guide plate and a lower guide plate. The set of probes are disposed in both the upper and lower guide plates via openings. In this example, the upper guide plate preferably surrounds the base ends of the probes via openings and the lower guide plate preferably surrounds the tip ends of the probes via the openings. In an alternative embodiment, a set of probes are disposed in a total of three guide plates comprising openings, one upper guide plate and two lower guide plates. The probes disposed in the openings of the guide plates and being surrounded by the guide plates creates greater stability of the probes.

Figure 3A:
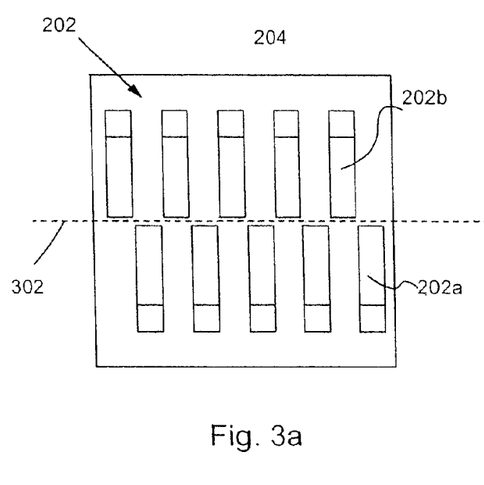
FIGS. 3a-d show four orthogonal views of the embodiment of FIGS. 2a-b.
Figure 3B:
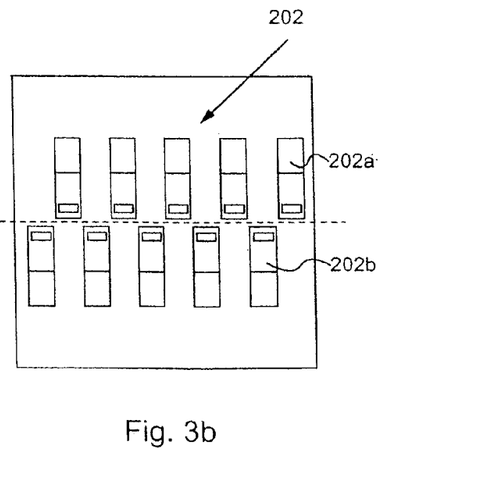
Figure 3C:
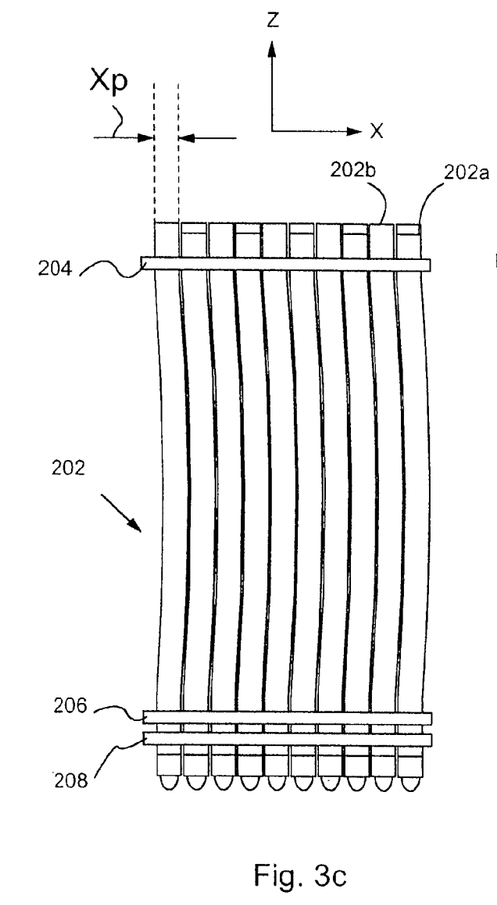
Figure 3D:
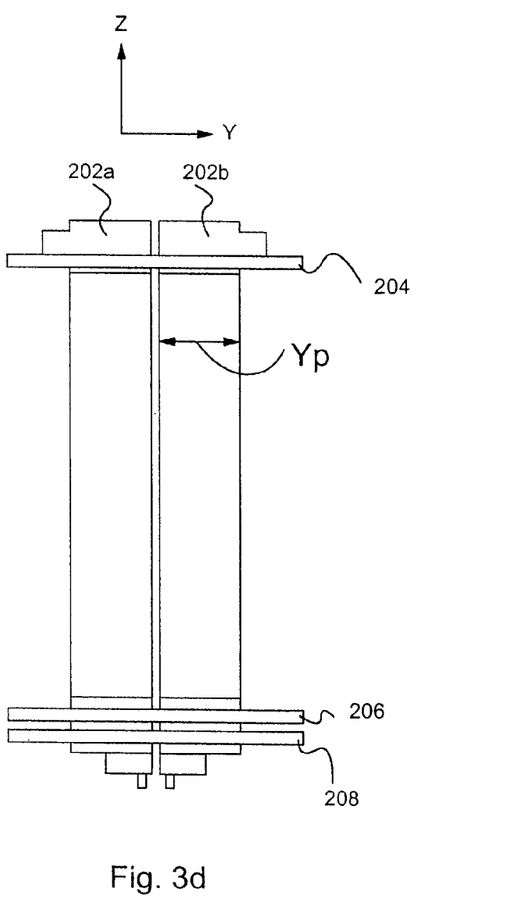

The key features of this example are best appreciated in the orthogonal views of FIGS. 3a-d. It is convenient to define coordinate directions as follows: the X direction is in the plane of the device under test and is parallel to the line of probe tips; the Y direction is in the plane of the device under test and perpendicular to X; and the Z direction is orthogonal to X and Y. These coordinate axes are shown in the views of FIGS. 3c-d.

FIG. 3b shows a bottom view of the probe array (i.e., looking up toward the probe tips. From this view, it is apparent that this embodiment is suitable for making contact to two parallel rows of contact pads as on FIG. 4. More specifically, a first set of probes is arranged so that their tips are arranged along a first lateral probe array line, and a second set of probes is arranged so that their tips are arranged along a second lateral probe array line parallel to the first array line. In this example, the probe spacing (i.e., pitch) is the same along the first and second array lines, and the two sets of probes are offset from each other in the array line direction by half the pitch. Contact pads having such an arrangement are commonly encountered in practice, and several features of this example are advantageous for probing such staggered contact pad arrangements.

For example, it is preferred for each probe tip (shown in detail as 512 on FIG. 5) to be displaced from the center of its corresponding probe toward a center line 302 of the probe array, as shown on FIG. 3b. This arrangement of the tips facilitates probing closely spaced lines of contact pads. Another feature, best seen on FIG. 3a, is that each probe comprises a positioning device (including but not limited to a tab shown in detail as 508 on FIG. 5) for engaging with upper plate 204 faces away from center line 302. This arrangement of the positioning devices also facilitates probing closely spaced lines of contact pads, since unnecessary reduction in probe to probe mechanical clearance caused by the positioning devices is thereby avoided. For example, it is apparent from FIG. 3a that if the orientation of the positioning device on each probe were reversed, the probe to probe minimum separation would be unnecessarily reduced by the positioning device.

A further such feature is that all probes in array 302 curve in the same direction in the X-Z plane, as best seen in the side view of FIG. 3c. This arrangement of probe curvature is also preferred for probing closely spaced contact pads, because it is preferred for all probes to scrub in the same direction. This is important because it facilitates consistently aligning scrub marks relative to centers of the corresponding contact pads. If the probe curvatures were not all in the same direction, the scrub marks would extend from slot centers in opposite directions, thereby preventing the centering of all scrub mark areas to contact pad centers. Since the scrub marks are small, manufacturers frequently like to position the scrub marks consistently at a particular location on each pad—not necessarily at the pad center—creating an undisturbed section of contact pad which is later used as the wire-bonding zone, because adhesion is better to undisturbed pad surfaces. One consequence of having all probes curve in the same direction, in combination with the above-described offsets of the tips and positioning devices is that array 202 includes two types of probes, which can be regarded as "left" and "right" versions of the same probe. Probes 202a and 202b are of different type, and can be regarded as example of left and right probes respectively (or vice versa). The end view of FIG. 3d shows the differences between probes 202a and 202b most clearly, where it should be noted that probes 202a and 202b curve in the same direction, as shown on FIG. 3c.

FIGS. 3c and 3d show a key aspect of this embodiment of the invention. More specifically, the probes of array 202 have a substantially rectangular cross section, where the pertinent dimensions are shown as Xp and Yp on FIGS. 3c-d and Xp<Yp. The combination of Xp<Yp and probe curvature in the X-Z plane is basically what provides the controlled sideways scrub as described above. More specifically, by having Xp<Yp, the probes can more easily bend in the X direction than in the Y direction. By having the probe curvature be in the X-Z plane, this probe curvature helps define and control the scrub motion of the probe tips on the corresponding contact pads. Finally, the overall mechanical stability is improved by having the probe length Yp be greater than the width Xp, thereby avoiding the above-described problems relating to wire-like probes.

Another way to understand this aspect of the invention is as follows. The probe width (i.e., Xp) is constrained to be less than the contact pad spacing or pitch. If Yp is comparable to Xp, then for small Xp the resulting probe is a wire-like probe that is difficult to handle. If Yp is greater than Xp in a conventional vertical probe array (e.g., as shown on FIG. 1b), then there is an inconsistency in the design—the natural deflection direction for the probes is in the X direction, because Xp<Yp, but the probe curvature in the Y-Z plane acts to control deflection in the Y direction. According to the present invention, this inconsistency is removed by altering the plane of probe curvature from the Y-Z plane (as on FIG. 1b) to the X-Z plane (as on FIG. 3c). As a result of this change, the perpendicular scrub of FIG. 1c is changed to the sideways scrub of FIG. 4. Briefly, a small Xp allows for probing of closely spaced contacts, while a relatively large Yp provides mechanical robustness and current carrying capacity.

Figure 4:
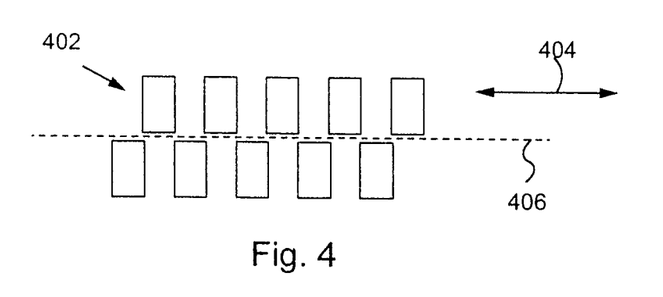
FIG. 4 shows the relation between contact pad arrangement and scrub direction for probe arrays according to embodiments of the invention.

FIG. 4 shows the relation between contact pad arrangement and scrub direction for probe arrays according to embodiments of the invention. As described above, array 402 of contact pads having contact line 406 is probed by a probe array having scrub motion 404 parallel to contact line 406. With this scrub motion direction, it is especially important for the scrub motion to be small and well-controlled, since an excessive scrub motion can cause a probe to make contact with an incorrect contact pad. For example, in one design, the sideways scrub length is only 8 µm. The conventional probe scrub motion direction of FIG. 1b has much more forgiving tolerances on scrub motion, especially since contact pad length (parallel to scrub direction 110) tends to be greater than contact pad width (parallel to array line 108).

Thus it can be observed that changing from normal scrub (FIG. 1b) to sideways scrub (FIG. 4) unexpectedly provides a solution to the above-described design difficulties due to decreasing probe pitch. It turns out, surprisingly, that the difficulties of controlling scrub motion sufficiently well to make a sideways scrub viable for closely spaced contact pads are substantially less than the difficulties faced in making a normal scrub viable for closely spaced contact pads.

Figure 5:
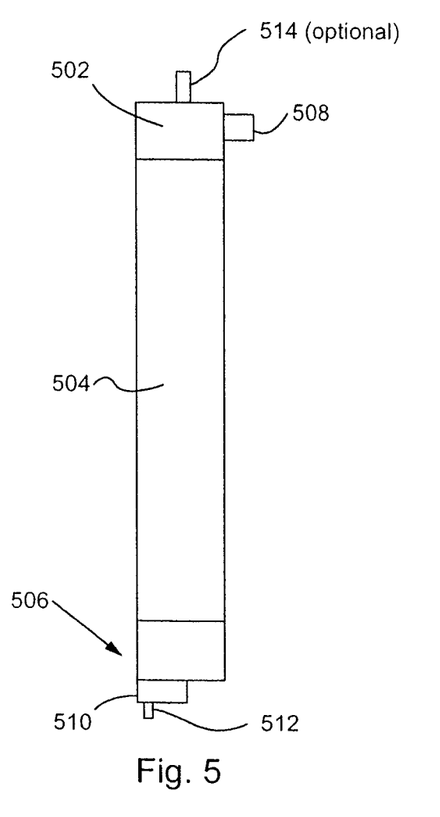
FIG. 5 shows a detailed side view of a probe of the embodiment of FIGS. 2a-b.

FIG. 5 shows a detailed side view of a probe of the embodiment of FIGS. 2a-b. This probe includes base end 502, tip end 506 and shaft 504 connecting the base end to the tip end. Probe shaft 504 is curved as described above, while probe base end 502 fits into a slot (or other opening of any shape) in upper guide plate 204 and probe tip end 506 fits into slots (or other opening of any shape) in lower guide plates 206 and 208. Positioning device 508 is present on base end 502 to provide a substantially vertical position reference relative to upper guide plate 204. Alternatively, it is possible to provide the vertical reference relative to a lower guide plate, but use of the upper guide plate for vertical reference is preferred. Probe curvature tends to be slight. For example, in one design, a probe having $Xp=30$ μm and $Yp=75$ μm has a maximum curve offset of 75 μm. In the example of FIG. 5, tip end 506 includes tip pedestal 510 and tip 512. Tip pedestal 510 is optional, but is preferred for probes having short tip 512 (e.g., on the order of 10 μm high). In such cases, the presence of pedestal 510 reduces the chance that some part of tip end 506 other than tip 512 undesirably makes contact with the device or circuit under test, or with nearby structures such as wafer insulation coating etc. Preferably, tip 512 is made of a material, such as rhodium, suitable for making reliable temporary electrical connections. In some embodiments, base end 502 can also be made of a material suitable for making temporary electrical connections, and can include optional base contact point 514. Such embodiments are of interest when temporary connections are formed between the base ends of the probes and the test equipment to which the probe array is mounted.

More generally, base end 502 and tip end 506 can be formed of different materials than shaft 504. Rhodium, hard gold, and palladium are examples of suitable materials.

Figure 6:
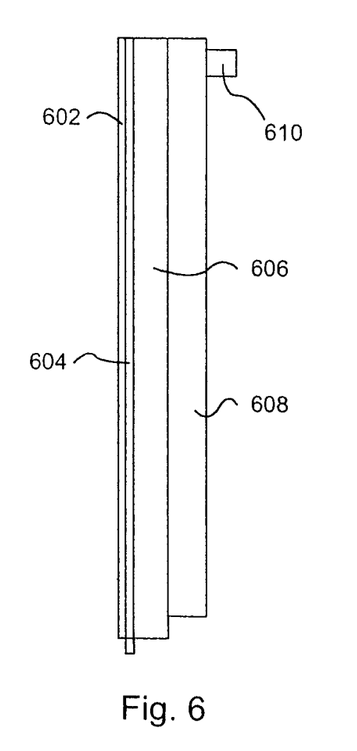
FIG. 6 shows a multi-layer probe suitable for use in embodiments of the invention.

FIG. 6 shows a multi-layer probe suitable for use in embodiments of the invention. In this example, the probe has five layers, 602, 604, 606, 608, and 610, although any number of layers may be utilized. In one embodiment, each layer is parallel to the X-Z plane, so lithographic patterning techniques combined with metal deposition techniques (e.g., plating) can be employed to precisely determine the curvature of shaft 504 in the X-Z plane. However, it is not required that the layers be parallel with the X-Z plane, and thus can be in any configuration. Use of multiple probe layers provides a convenient way of defining probe features such as tip 512 (part of layer 604) and positioning device 508 (i.e., layer 610). Different probe layers can have different material composition, which is one way to provide different material compositions for, e.g., tip 512 and shaft 504. Material composition can also vary within a layer, e.g., rhodium may only be present in the tip part of layer 604.

The preceding description has been by way of example as opposed to limitation. In particular, the invention is not limited to probing contact pads arranged as in FIG. 4. Embodiments of the invention are suitable for probing any configuration of contact pads including two or more contact pads in a line. For example, contact pads arranged around the periphery of a chip can be probed. In another example, contact pads that are arranged across an entire surface of a chip or die can be probed. Also, contact pads arranged on multiple chips or dies can be probed simultaneously. The invention is also applicable for probing irregular sets of contact pads, e.g., flip chip bumps, provided the set of contact pads includes at least one line of contact pads which can be probed with a sideways scrub.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An apparatus for making electrical contact to a device under test comprising:
   a set of two or more probes, each probe of said set including a base end, an opposing distal tip end, and a shaft connecting said base end to said tip end;
   said base end of each probe of said set comprising a positioning device disposed on a side of said base end of each probe of said set;
   each probe of said set comprising a plurality of layers;
   at least one guide plate comprising openings; and
   said probes disposed within said openings, said guide plate surrounding said probes via said openings;
   wherein said tip ends of said set of probes are capable of performing a sideways scrub motion as contact is made to an array of contact pads on the device under test.

2. The apparatus of claim 1 wherein said tip ends of said set of probes are disposed along an arrangement of contact pads.

3. The apparatus of claim 1 wherein said at least one guide plate comprises at least an upper guide plate within which said base ends of said set of probes are disposed.

4. The apparatus of claim 1 wherein said at least one guide plate comprises at least one lower guide plate within which said tip ends of said set of probes are disposed.

5. The apparatus of claim 4 further comprising a second lower guide plate comprising openings within which said tip ends are disposed.

6. The apparatus of claim 1 wherein said at least one guide plate comprises an upper guide plate and a lower guide plate.

7. The apparatus of claim 6 further comprising a second lower guide plate comprising openings within which said tip ends are disposed.

8. The apparatus of claim 1 wherein, for each said probe, said tip end and said base end have a different material composition than said shaft.

9. The apparatus of claim 8 wherein, for each said probe, said tip end and said base end have material compositions suitable for making temporary electrical contact via mechanical contact.

10. The apparatus of claim 1 wherein each said probe is replaceable in said apparatus.

11. The apparatus of claim 1 further comprising:
   a second set of two or more probes, each probe of said second set including a base end, a tip end, and a shaft connecting said base end to said tip end;
   wherein said at least one guide plate includes openings within which said second set of probes are disposed; and
   said guide plate surrounding said second set of probes via said openings.

12. The apparatus of claim 11 wherein said tip ends of said first set of probes are spaced by a first pitch and wherein said tip ends of said second set of probes are spaced by a second pitch.

13. The apparatus of claim 12 wherein said first pitch and said second pitch are substantially equal, and wherein said first and second sets of probes are offset from each other by substantially half said first pitch in a direction X.

14. The apparatus of claim 11 wherein a center line of said apparatus is parallel to and substantially halfway between said set of two or more probes and said second set of two or more probes.

15. The apparatus of claim 14 wherein each said tip end of each said probe of said first and second sets of probes further comprises a tip for making electrical contact to the device under test, and wherein each said tip is displaced from a center of its corresponding probe toward said center line, whereby separation between said first and second sets of probes can be increased.

16. The apparatus of claim 11 wherein each said shaft of each said probe of said first and second sets of probes curves in the same direction.

17. The apparatus of claim 11 wherein said tip ends of said second set of probes are disposed along an arrangement of contact pads.

18. The apparatus of claim 1 wherein said set of probes comprises a substantially rectangular cross section.

19. The apparatus of claim 18 wherein said rectangular cross section of said set of probes comprises a lateral dimension Xp1 in a direction X parallel to said probe array line and has a second lateral dimension Yp1 in a direction Y perpendicular to said probe array line, wherein Xp1<Yp1.

20. The apparatus of claim 1 wherein said probes are substantially vertical.

21. The apparatus of claim 20 wherein said set of probes are substantially aligned with a vertical direction Z perpendicular to said probe array line, and wherein each said probe shaft of said first set of probes has a predetermined curvature in an X-Z plane.

22. The apparatus of claim 1 wherein said plurality of layers comprise metallic layers.

23. The apparatus of claim 1 further comprising a tip pedestal disposed on said tip end.

24. The apparatus of claim 1 wherein at least one said guide plate comprises an electrically insulated material.

25. The apparatus of claim 1 wherein said positioning device comprises one of said plurality of layers.

26. The apparatus of claim 1 wherein said positioning device extends in a substantially perpendicular direction to each probe of said set.

27. The apparatus of claim 1 wherein each probe comprises a tip offset from a center of said probe.

28. The apparatus of claim 1 wherein each probe comprises a tip, said tip and said shaft comprising different materials.

* * * * *